(12) United States Patent
Kim et al.

(10) Patent No.: US 7,759,180 B2
(45) Date of Patent: Jul. 20, 2010

(54) DISPLAY SUBSTRATE AND METHOD OF MANUFACTURING THE SAME

(76) Inventors: Young-Min Kim, #519-204, Samsung 5cha Apt., Pungdeokcheon2-dong, Yongin-si, Gyeonggi-do (KR); Tae-Young Choi, #102-605, Hyundai Apt., Donam 1-dong, Seongbuk-gu, Seoul (KR)

( * ) Notice: Subject to any disclaimer, the term of this patent is extended or adjusted under 35 U.S.C. 154(b) by 38 days.

(21) Appl. No.: 12/203,859

(22) Filed: Sep. 3, 2008

(65) Prior Publication Data

US 2009/0146137 A1 Jun. 11, 2009

(30) Foreign Application Priority Data

Dec. 7, 2007 (KR) .................. 10-2007-0126784

(51) Int. Cl.
*H01L 21/84* (2006.01)
*H01L 21/00* (2006.01)
(52) U.S. Cl. ................. 438/161; 257/40; 257/E21.299; 438/82; 438/99; 438/149; 438/163
(58) Field of Classification Search .................. 257/40, 257/E21.299; 438/82, 99, 149, 161, 163
See application file for complete search history.

(56) References Cited

U.S. PATENT DOCUMENTS

| 7,659,138 | B2* | 2/2010 | Hirakata et al. | ............... 438/99 |
| 2006/0145148 | A1* | 7/2006 | Hirai et al. | .................... 257/40 |
| 2006/0267003 | A1* | 11/2006 | Suh et al. | ....................... 257/40 |
| 2008/0048181 | A1* | 2/2008 | Tanaka et al. | .................. 257/40 |
| 2009/0209069 | A1* | 8/2009 | Hirakata et al. | ............. 438/158 |

* cited by examiner

*Primary Examiner*—Asok K Sarkar
(74) *Attorney, Agent, or Firm*—Innovation Counsel LLP

(57) ABSTRACT

In a manufacturing method of a display substrate according to one or more embodiments, a plurality of thin films are patterned by using a photoresist film pattern having different thicknesses in each area on a substrate as etch masks. The photoresist film pattern may be etch-backed at least twice during the manufacturing process of the display substrate and may be used as the etch mask for patterns having shapes different from each other. Accordingly, the number of processes for manufacturing the mask patterns, which may be formed by a photolithography method in order to pattern the thin films formed on the substrate, may be reduced.

13 Claims, 18 Drawing Sheets

DISPLAY SUBSTRATE AND METHOD OF MANUFACTURING THE SAME

CROSS-REFERENCE TO RELATED APPLICATION

This application claims priority to and benefit from Korean Patent Application No. 2007-0126784 filed on Dec. 7, 2007, the contents of which are herein incorporated by reference in their entirety.

BACKGROUND

1. Technical Field

Embodiments of the present invention generally relate to a display substrate and a method of manufacturing the display substrate.

2. Description of the Related Art

In general, a display apparatus that displays an image includes a display substrate. A plurality of pixel areas that displays an image is defined in the display substrate. Each pixel area includes a thin film transistor and a pixel electrode electrically connected to the thin film transistor.

The thin film transistor includes a semiconductor pattern to selectively provide the pixel electrode with a pixel voltage according to a voltage applied to a gate electrode thereof. The semiconductor pattern includes an organic semiconductor such as amorphous silicon or pentacene.

When the semiconductor pattern includes an organic semiconductor, the organic semiconductor is formed on the display substrate through an inkjet method. When forming the organic semiconductor on the display substrate through the inkjet method, precise patterning of the organic semiconductor is difficult. Thus, a technology has been proposed for forming a bank pattern on the display substrate and introducing the organic semiconductor into an opening of the bank pattern before forming the organic semiconductor on the display substrate.

However, when forming the organic semiconductor on the display substrate by using the bank pattern, this additional process of forming the bank pattern would be required. Thus, the number of processes for the display substrate increases, thereby increasing the manufacturing cost of the display substrate.

SUMMARY

Embodiments of the present invention generally provide a display apparatus having a simplified structure and reduced manufacturing cost and a method of manufacturing the display substrate.

In one aspect of an embodiment of the present invention, a method of manufacturing a display substrate is provided as follows. A gate electrode is formed on a substrate and a gate insulating layer is formed on the substrate to cover the gate electrode. Then, first and second conductive layers are sequentially formed on the gate insulating layer to form a source-drain layer, and a first insulating layer pattern is formed on the source-drain layer. A preliminary source-drain layer is formed by patterning the source-drain layer by using the first insulating layer pattern and a second insulating layer pattern, which is formed by primarily etching the first insulating layer pattern, as etch masks, respectively. A third insulating layer pattern is formed by secondarily etching the second insulating layer pattern, and a surface treatment is performed relative to the substrate. A source electrode and a drain electrode, which are spaced apart from each other, are formed by patterning the preliminary source-drain layer, and an organic semiconductor layer is formed on the source and drain electrodes. Then, a pixel electrode electrically connected to the drain electrode is formed on the substrate.

In another aspect of an embodiment of the present invention, a display substrate includes: a substrate in which a pixel area is defined, a gate line formed on the substrate, a gate insulating layer formed on the gate line to cover the gate line, a data line insulated from the gate line while crossing the gate line, and defining the pixel area in combination with the gate line, a gate electrode branching from the gate line, a source electrode branching from the data line, a drain electrode spaced apart from the source electrode, an organic semiconductor layer formed on the source electrode and the drain electrode, and a pixel electrode formed on the substrate in correspondence with the pixel area, and electrically connected to the drain electrode. In order to easily form the organic semiconductor layer on the gate insulating layer, the gate insulating layer has a different surface energy in each area. According to one or more embodiments, a portion of the gate insulating layer corresponding to an area in which the organic semiconductor layer is formed, has a surface energy greater than a surface energy of the gate insulating layer corresponding to an area in which the organic semiconductor layer is not formed.

According to the above description of one or more embodiments, when forming the organic semiconductor layer through an inkjet method, a bank pattern used for the organic semiconductor layer may be omitted. Accordingly, a photolithography process for the bank pattern may be omitted, so that the manufacturing process of the display substrate may be simplified and the manufacturing cost of the display substrate may be reduced.

BRIEF DESCRIPTION OF THE DRAWINGS

The above and other advantages of one or more embodiments of the present invention will become readily apparent by reference to the following detailed description when considered in conjunction with the accompanying drawings wherein.

DETAILED DESCRIPTION

Figure 1A:
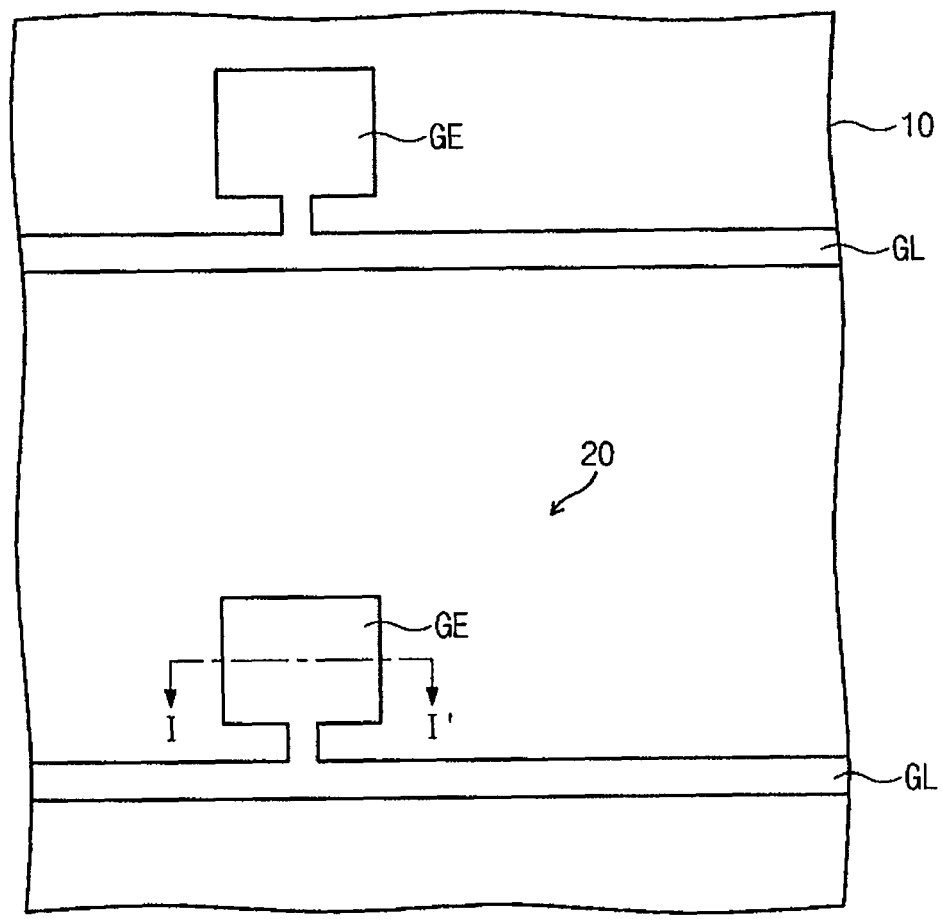
FIGS. 1A, 2A, 3A, 4A, 5A, 6A, 7A, 8A and 9A are plan views illustrating a method of manufacturing a display substrate according to one or more exemplary embodiments of the present invention.

Hereinafter, embodiments of the present invention will be explained in detail with reference to the accompanying drawings. However, the scope of the present invention is not limited to such embodiments and the present invention may be realized in various forms. Embodiments of the present invention are defined only by the scope of the appended claims. In addition, the size of layers and regions shown in the drawings may be simplified or magnified for the purpose of clear expla- FIGS. 1A, 2A, 3A, 4A, 5A, 6A, 7A, 8A and 9A are plan views illustrating a method of manufacturing a display substrate according to one or more exemplary embodiments of the present invention, and FIGS. 1B, 2B, 3B, 4B, 5B, 6B, 7B, 8B and 9B are cross-sectional views taken along line I-I' shown in FIGS. 1A, 2A, 3A, 4A, 5A, 6A, 7A, 8A and 9A, respectively, according to one or more embodiments.

Figure 1B:
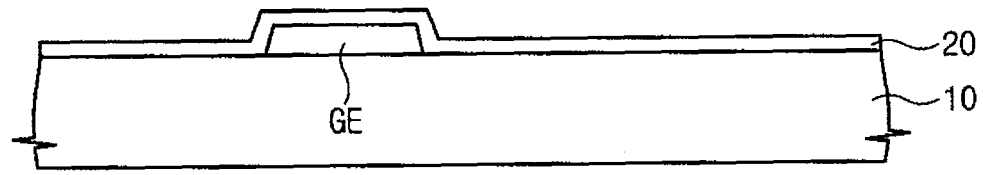
FIGS. 1B, 2B, 3B, 4B, 5B, 6B, 7B, 8B and 9B are cross-sectional views taken along line I-I' shown in FIGS. 1A, 2A, 3A, 4A, 5A, 6A, 7A, 8A and 9A, respectively, according to one or more embodiments.

Referring to FIGS. 1A and 1B, a gate line GL and a gate electrode GE branching from the gate line GL are formed on a substrate 10. After forming the gate line GL and the gate electrode GE on the substrate 10, a gate insulating layer 20 that covers the gate line GL and the gate electrode GE is formed on the substrate 10. The gate line GL and the gate electrode GE may be made by forming a conductive layer (not shown) on the substrate 10 and patterning the conductive layer.

In the present exemplary embodiment, the substrate 10 may include a transparent glass base material. However, the substrate 10 may also include other transparent and flexible materials, e.g. plastic.

Figure 2A:
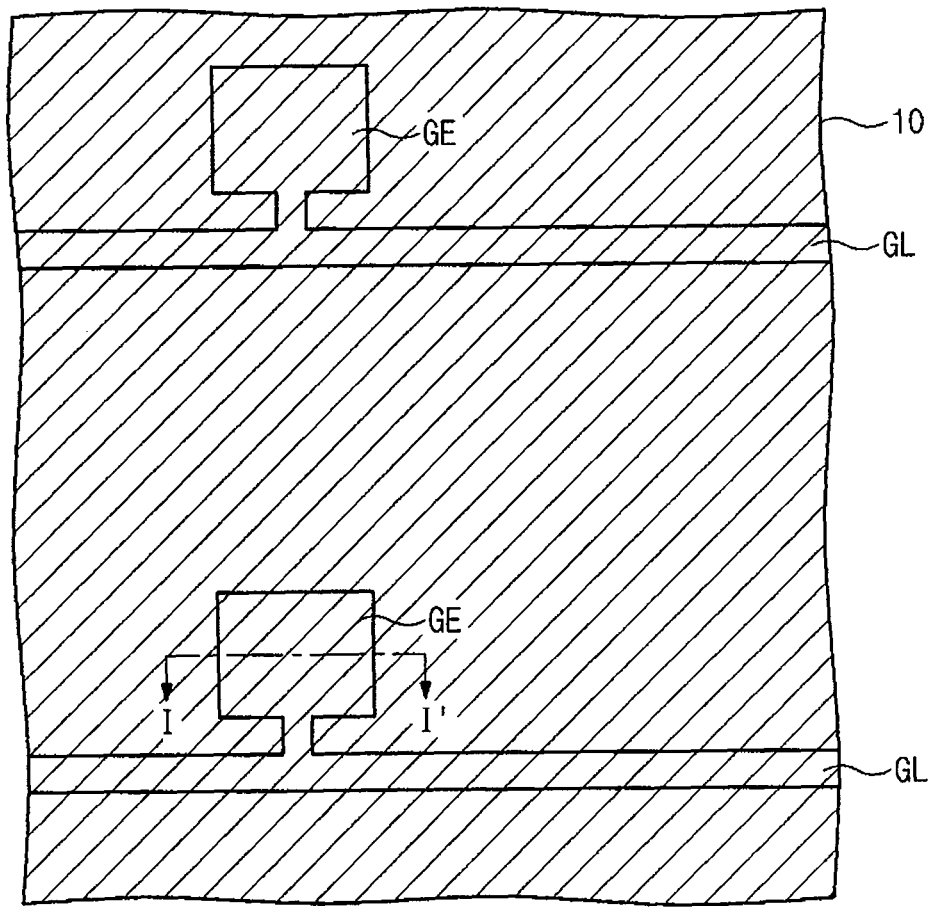
Figure 2B:
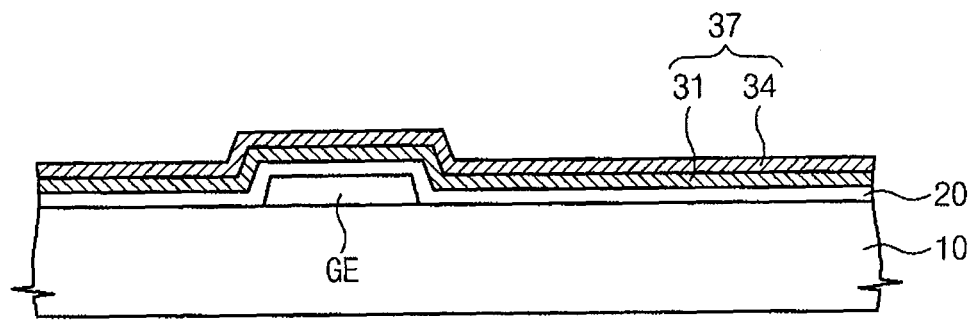

Referring to FIGS. 2A and 2B, a first conductive layer 31 and a second conductive layer 34 are sequentially formed on the substrate 10 to form a source-drain layer 37. The first and second conductive layers 31 and 34 are sequentially formed on the substrate 10 because a surface treatment process for the substrate 10 is performed between a patterning process for the first conductive layer 31 and a patterning process for the second conductive layer 34. Detailed descriptions of the surface treatment process according to one or more embodiments will be given with reference to FIGS. 5A and 5B.

Figure 3A:
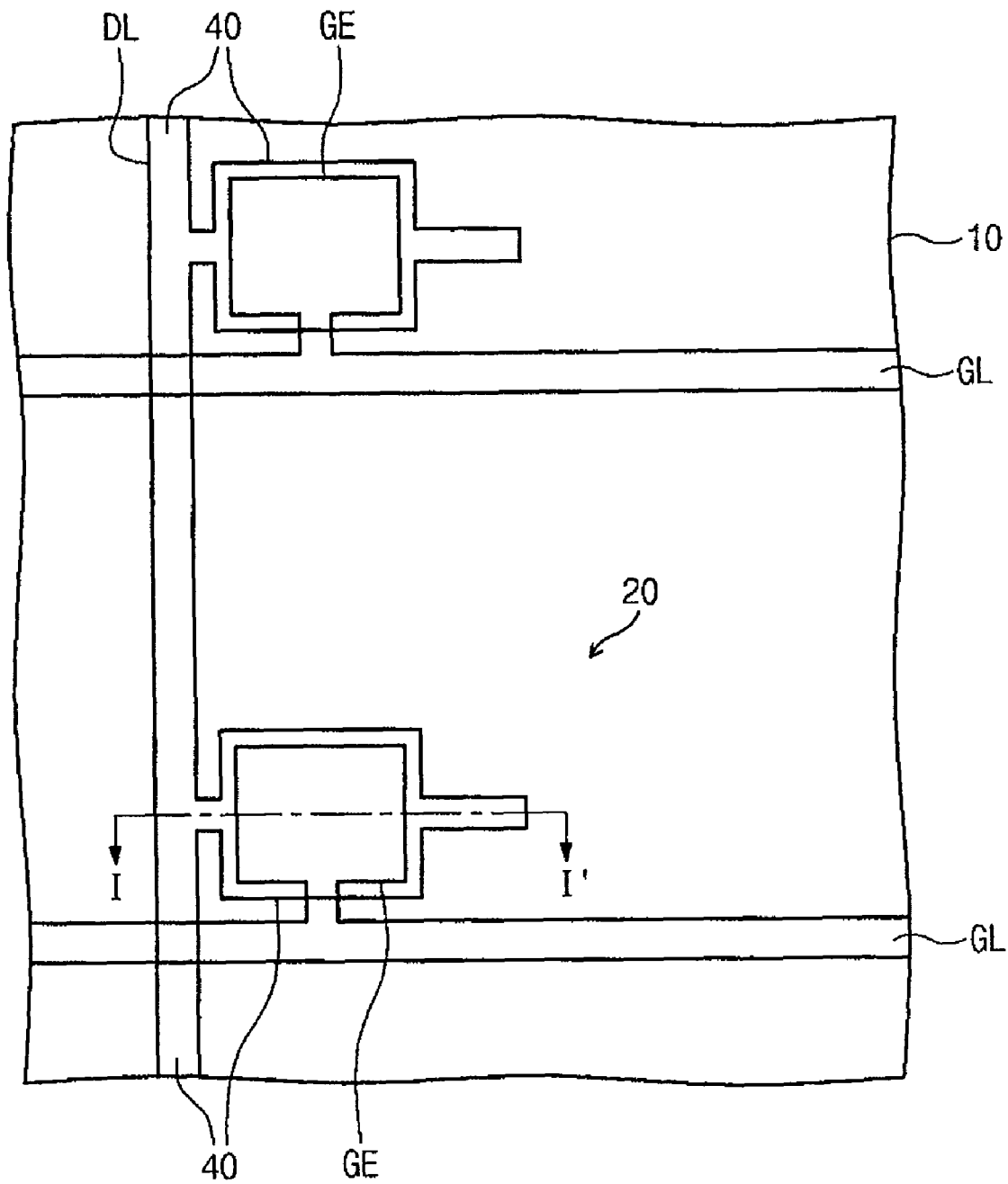
Figure 3B:
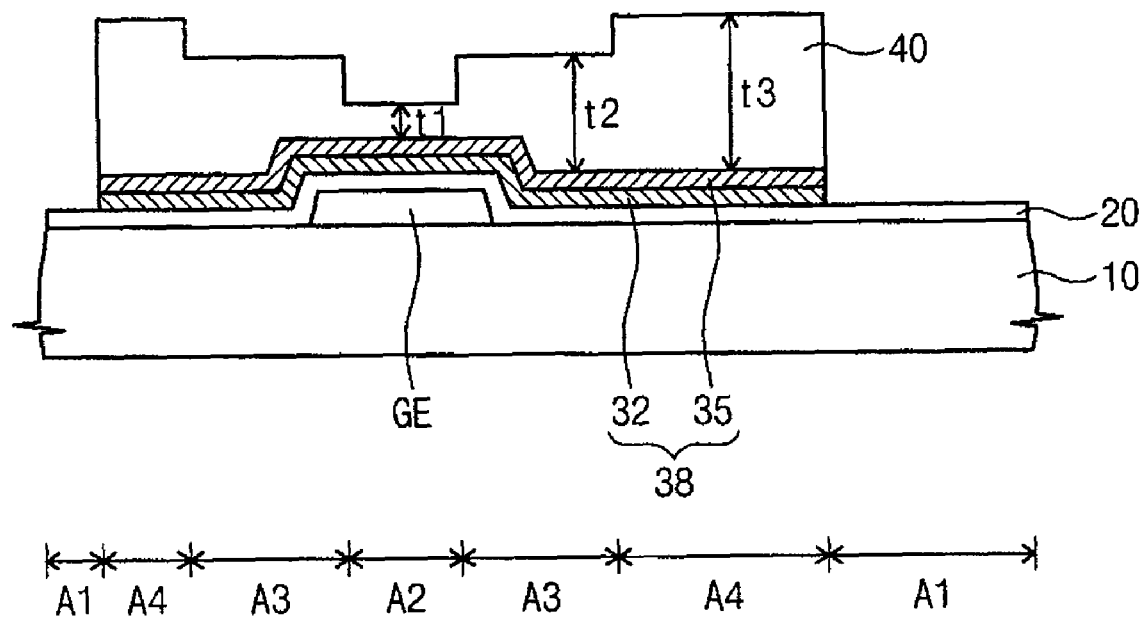

Referring to FIGS. 2B, 3A and 3B, a first insulating layer pattern 40 is formed on the source-drain layer 37. The first insulating layer pattern 40 is removed corresponding to a first area A1 to form an opening. The first insulating layer pattern 40 may have thicknesses that are different from each other in the second to fourth areas A2 to A4, respectively. According to an embodiment, the first insulating layer pattern 40 has a first thickness t1 in the second area A2, a second thickness t2 greater than the first thickness t1 in the third area A3, and a third thickness t3 greater than the second thickness t2 in the fourth area A4.

The first insulating layer pattern 40 may be formed by forming a photoresist film on the substrate 10, exposing the photoresist film by using a photomask formed with a slit pattern and a transflective member, and developing the photoresist film. Furthermore, the first insulating layer pattern 40 may also be formed through an imprint scheme, in which an imprint resin layer is formed on the substrate 10, and then the imprint resin layer is pressed by a mold. These two methods of forming the first insulating layer pattern 40 according to one or more embodiments will be described in more detail with reference to FIGS. 10 and 11.

Figure 10:
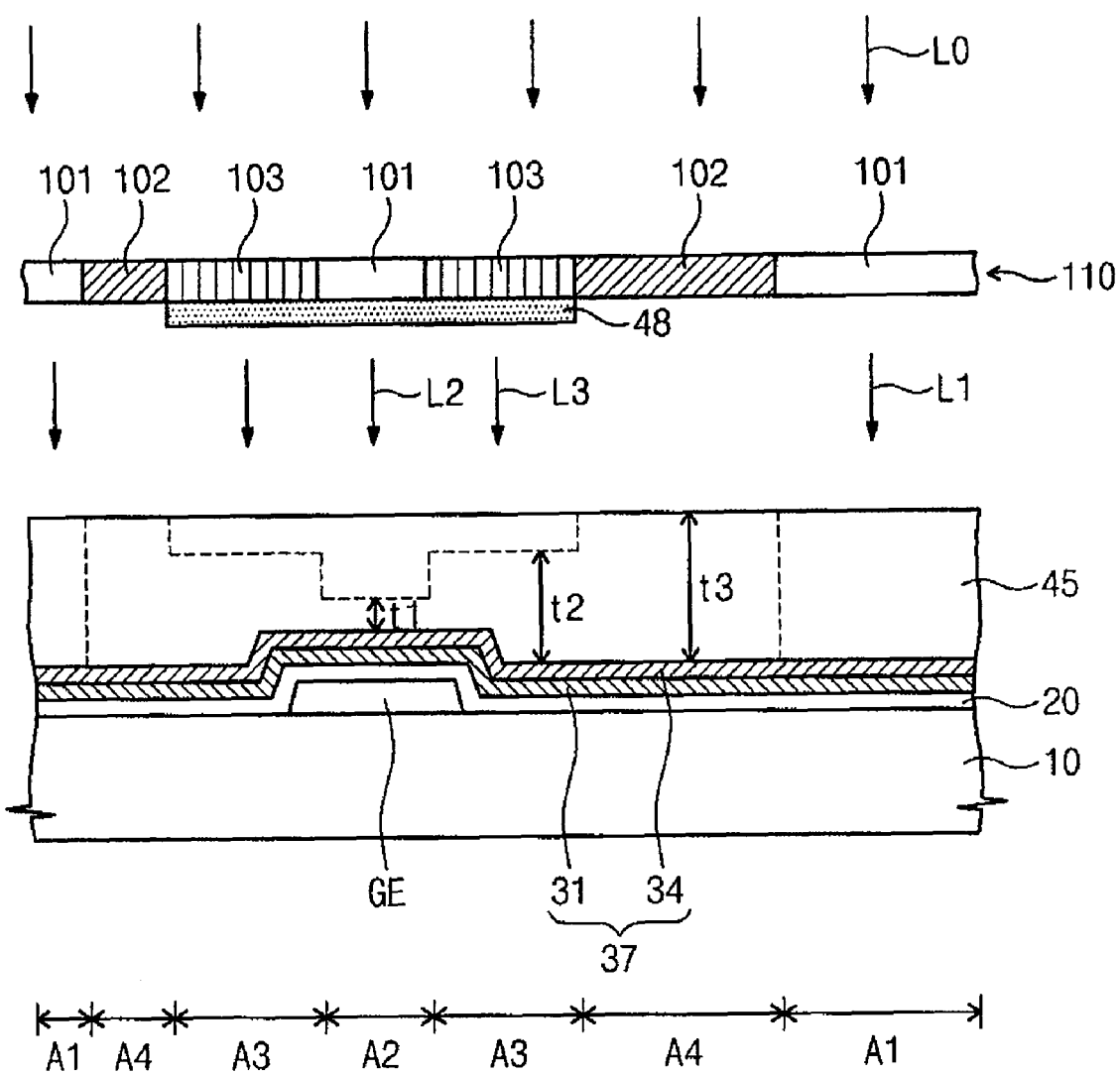
FIG. 10 is a sectional view illustrating a method of forming the first insulating layer pattern shown in FIG. 3B according to an embodiment.

FIG. 10 is a sectional view illustrating a method of forming the first insulating layer pattern 40 according to an embodiment. Referring to FIG. 10, a photoresist film 45 having positive photosensitivity is formed on the substrate 10 on which the gate electrode GE, the gate insulating layer 20 and the source-drain layer 37 are formed.

After forming the photoresist film 45 on the substrate 10, a photomask 110 is aligned above the substrate 10 such that the photomask 110 faces the substrate 10, and source light L0 is irradiated onto the photoresist film 45 to expose the photoresist film 45.

A first part of the photomask 110 corresponding to the first area A1 is open or prepared in the form of a transmitting member 101, a second part of the photomask 110 corresponding to the second area A2 is prepared in the form of a transflective member 48, a third part of the photomask 110 corresponding to the third area A3 is prepared in the form of the transflective member 48 and a slit pattern 103, and a fourth part of the photomask 110 corresponding to the fourth area A4 is prepared in the form of a light blocking member 102.

Accordingly, the first light L1 irradiated onto the first area A1 of the photoresist film 45 has a first light amount, the second light L2 irradiated onto the second area A2 has a second light amount smaller than the first light amount, the third light L3 irradiated onto the third area A3 has a third light amount smaller than the second light amount, and light is not irradiated onto the fourth area A4.

As the exposed photoresist film 45 is developed, the photoresist film 45 is partially removed according to the amount of the irradiated light. According to an embodiment, the photoresist film 45 may be completely removed from the first area A1, the photoresist film 45 has a first thickness t1 in the second area A2, the photoresist film 45 has a second thickness t2 greater than the first thickness t1 in the third area A3, and the photoresist film 45 has a third thickness t3 greater than the second thickness t2 in the fourth area A4.

Figure 11:
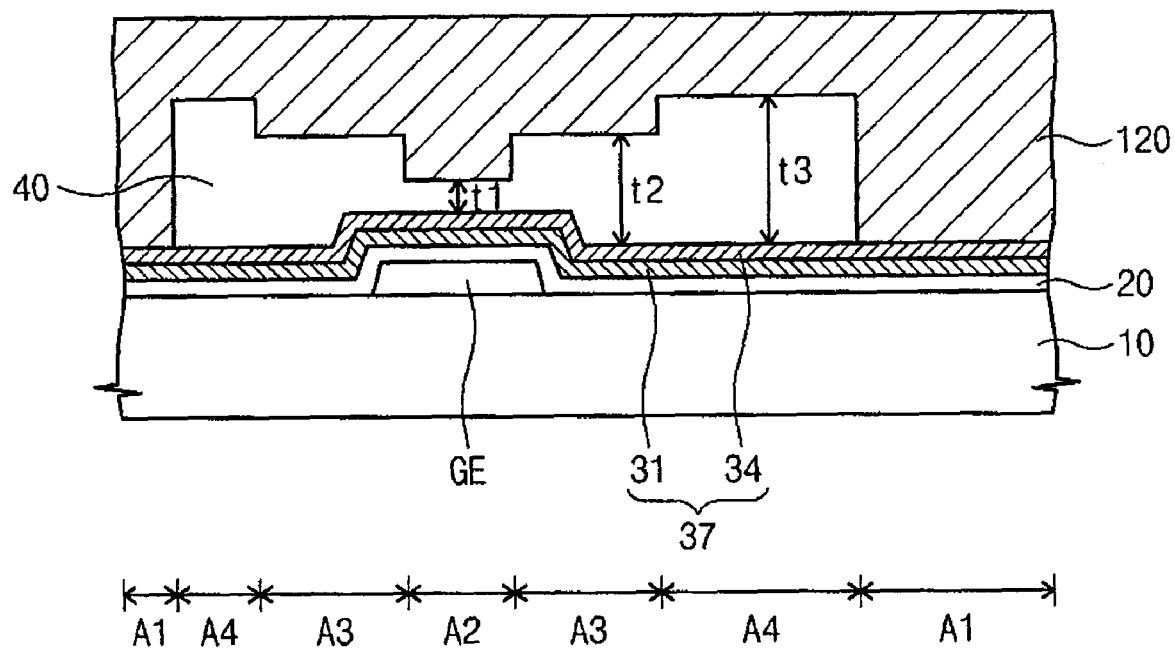
FIG. 11 is a sectional view illustrating a method of forming the first insulating layer pattern shown in FIG. 3B according to another exemplary embodiment of the present invention.

FIG. 11 is a sectional view illustrating a method of forming the first insulating layer pattern 40 according to another exemplary embodiment of the present invention. Referring to FIG. 11, after forming a photoresist film having photosensitivity on the substrate 10 on which the gate electrode GE, the gate insulating layer 20 and the source-drain layer 37 are formed, the first insulating layer pattern 40 may be formed by imprinting the photoresist film using a mold 120.

Although not shown in FIG. 11, after forming the first insulating layer pattern 40, the first insulating layer pattern 40 may be cured by irradiating light onto the first insulating layer pattern 40, then the mold 120 may be separated from the substrate 10 so that photoresist film patterns having thicknesses different from each other may be formed in each area.

Referring again to FIGS. 2B, 3A and 3B, after forming the first insulating layer pattern 40 on the substrate 10, the source-drain layer 37 is etched using the first insulating layer pattern 40 as an etch mask. Thus, the source-drain layer corresponding to the first area A1 is removed to form a preliminary source-drain pattern 38 that includes a data line, and first and second preliminary conductive patterns 32 and 35, and is located on the same plane with the first insulating layer pattern 40.

Figure 4A:
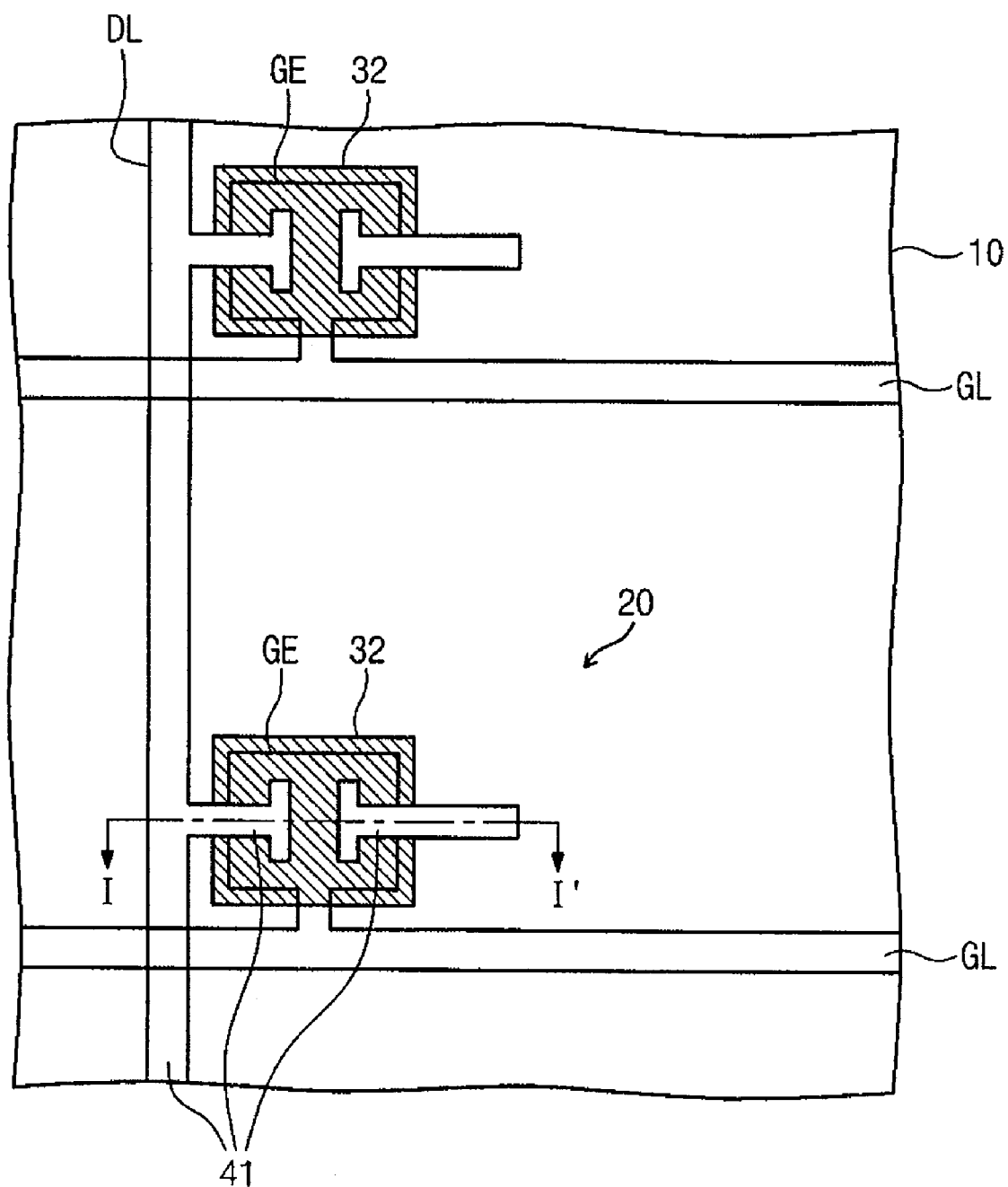
Figure 4B:
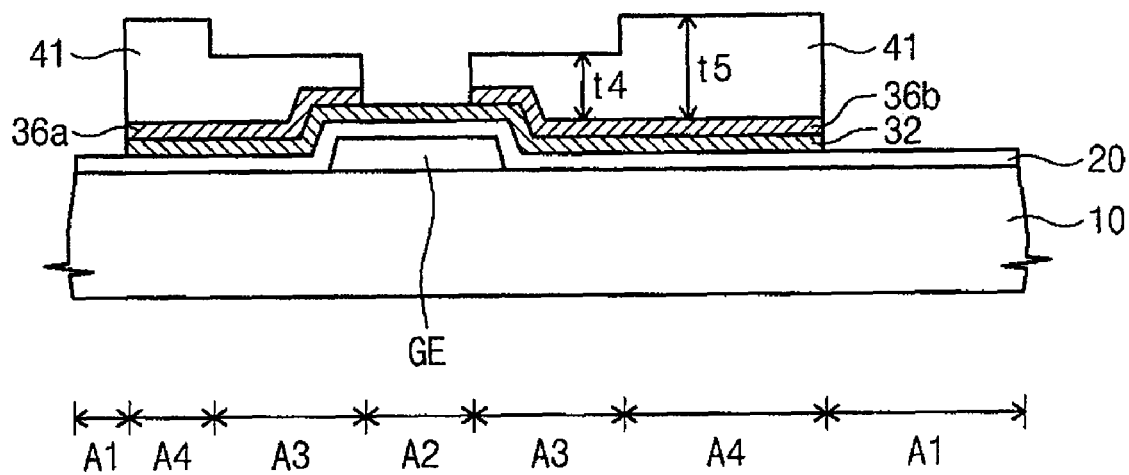

Referring to FIGS. 3B, 4A and 4B, a second insulating layer pattern 41 may be formed by performing a first etch-back process relative to the first insulating layer pattern 40. The second insulating layer pattern 41 has fourth and fifth thicknesses t4 and t5 in the third and fourth areas A3 and A4, respectively. The second insulating layer pattern 41 is completely removed from the first and second areas A1 and A2.

The first insulating layer pattern 40 is etched by the first thickness t1 through the first etch-back process. Thus, the fourth thickness t4 is identical to the difference between the second thickness t2 and the first thickness t1, and the fifth thickness t5 is identical to the difference between the third thickness t3 and the first thickness t1.

After forming the second insulating layer pattern 41 on the substrate 10, the second preliminary conductive pattern 35 corresponding to the second area A2 may be etched by using the second insulating layer pattern 41 as an etch mask to form a top preliminary source electrode 36a and a top preliminary drain electrode 36b.

Figure 5A:
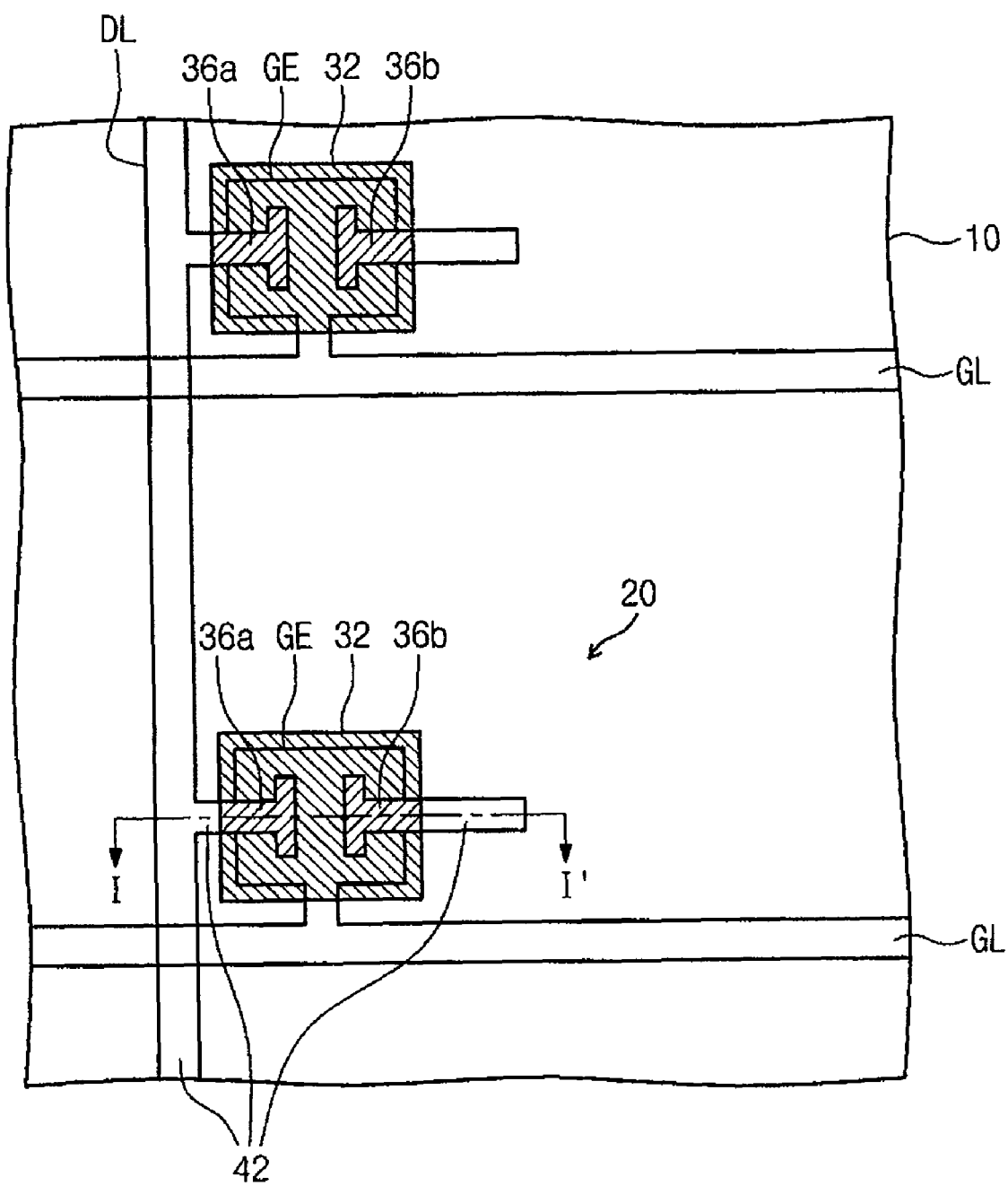
Figure 5B:
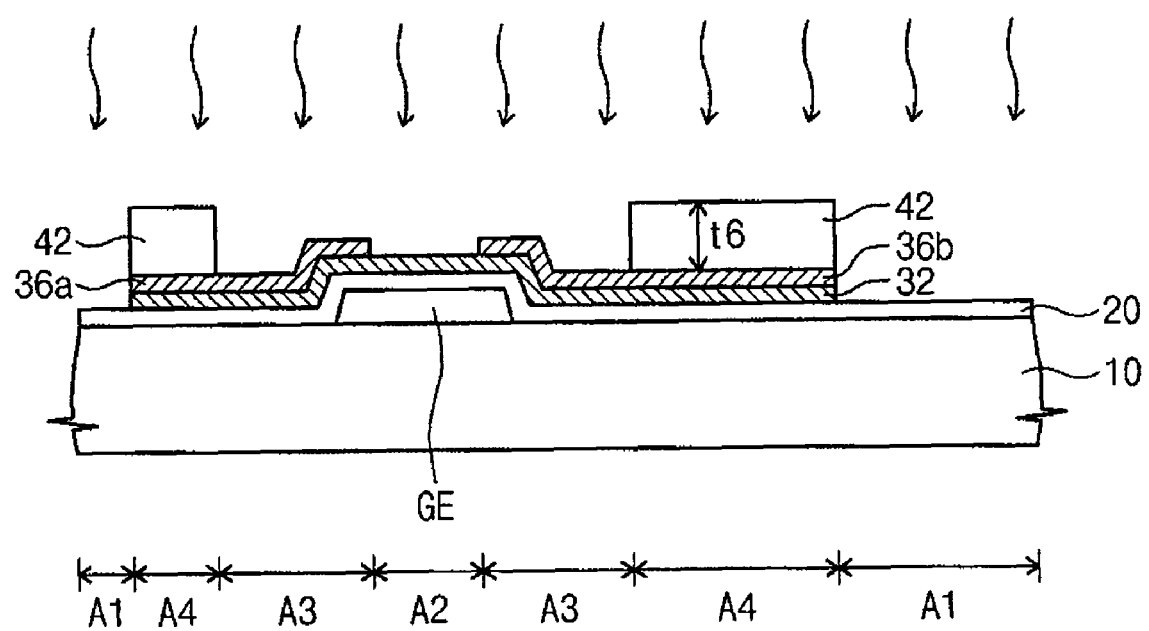

Referring to FIGS. 4B, 5A and 5B, a third insulating layer pattern 42 may be formed by performing a second etch-back process relative to the second insulating layer pattern 41. The third insulating layer pattern 42 has a sixth thickness t6 in the fourth area A4, and is completely removed from the first to third areas A1 to A3.

The second insulating layer pattern 41 is etched by the fourth thickness t4 through the second etch-back process. Thus, the sixth thickness t6 is identical to the difference between the fifth thickness t5 and the fourth thickness t4.

After forming the third insulating layer pattern 42 on the substrate 10, the substrate 10 may be subjected to a surface treatment process to reduce the surface energy of the outermost thin film exposed on the substrate 10. In the present exemplary embodiment, the surface treatment process for the substrate 10 may include plasma treatment.

The plasma treatment may increase or decrease the surface energy of the substrate 10 exposed to the exterior. Increasing or decreasing the surface energy of the substrate 10 exposed to the exterior through the plasma treatment may be determined according to the type of reaction gas used for the plasma treatment. According to the present exemplary embodiment, the plasma treatment may reduce the surface energy of the substrate 10 exposed to the exterior by using a reaction gas containing fluorine such as $CF_4$.

Since the third insulating layer pattern 42 is exposed to the exterior after the surface treatment is completed, the surface energy of the third insulating layer pattern 42 may be reduced through, for example, the plasma treatment. Furthermore, after the surface treatment is completed, the gate insulating layer 20 may have a different surface energy in each area. According to an embodiment, a portion of the gate insulating layer 20 overlapping with the first preliminary conductive pattern 32 may have a surface energy greater than that of a portion of the gate insulating layer 20 exposed to the exterior.

Figure 6A:
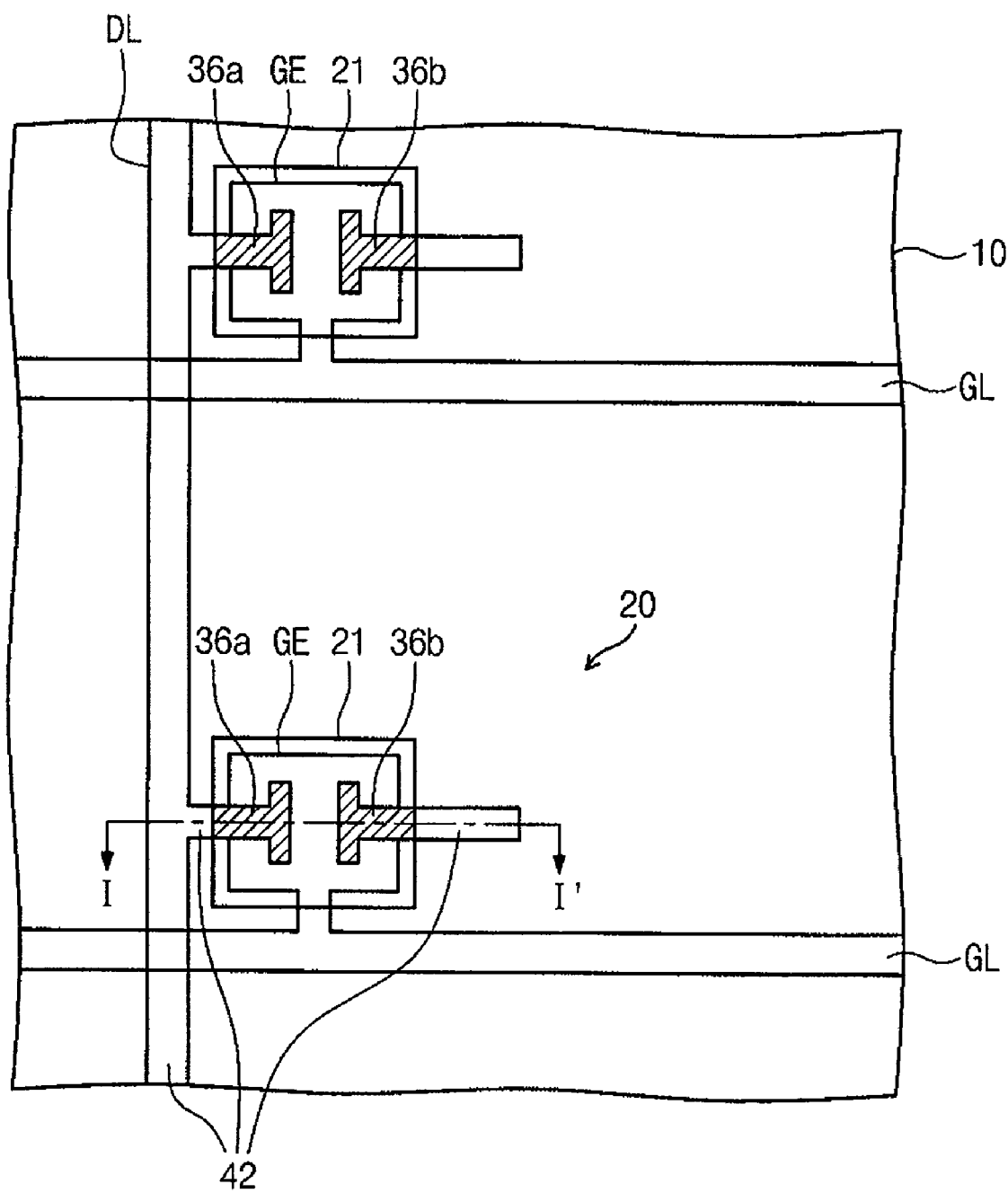
Figure 6B:
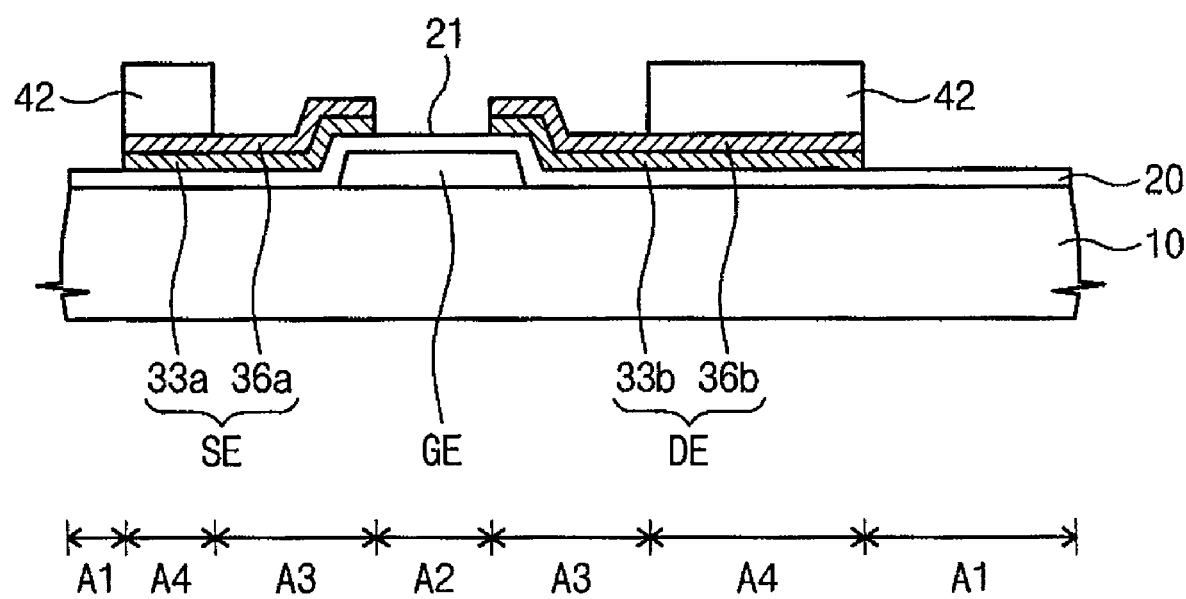

Referring to FIGS. 5B, 6A and 6B, the first preliminary conductive pattern 32 corresponding to the second area A2 may be etched using the top preliminary source electrode 36a and the top preliminary drain electrode 36b as etch masks, thereby forming a bottom source electrode 33a and a bottom drain electrode 33b while being spaced apart from each other.

Furthermore, the first preliminary conductive pattern 32 corresponding to the second area A2 may be etched to expose to the exterior a portion of the gate insulating layer 20, which corresponds to the second area A2. The exposed portion of the gate insulating layer 20 is referred to as a non-surface treatment section 21 since the non-surface treatment section 21 is not surface-treated through the surface treatment process. The non-surface treatment section 21 has a surface energy greater than that of a peripheral section such as the third insulating layer pattern 42.

If the non-surface treatment section 21 has a surface energy greater than that of a peripheral section, an organic, for example, semiconductor layer (reference number 50 of FIG. 8B) may be easily formed on the second and third areas A2 and A3 using an inkjet method. The surface energy of the non-surface treatment section 21 according to an embodiment will be described in detail with reference to FIGS. 8A and 8B.

Figure 7A:
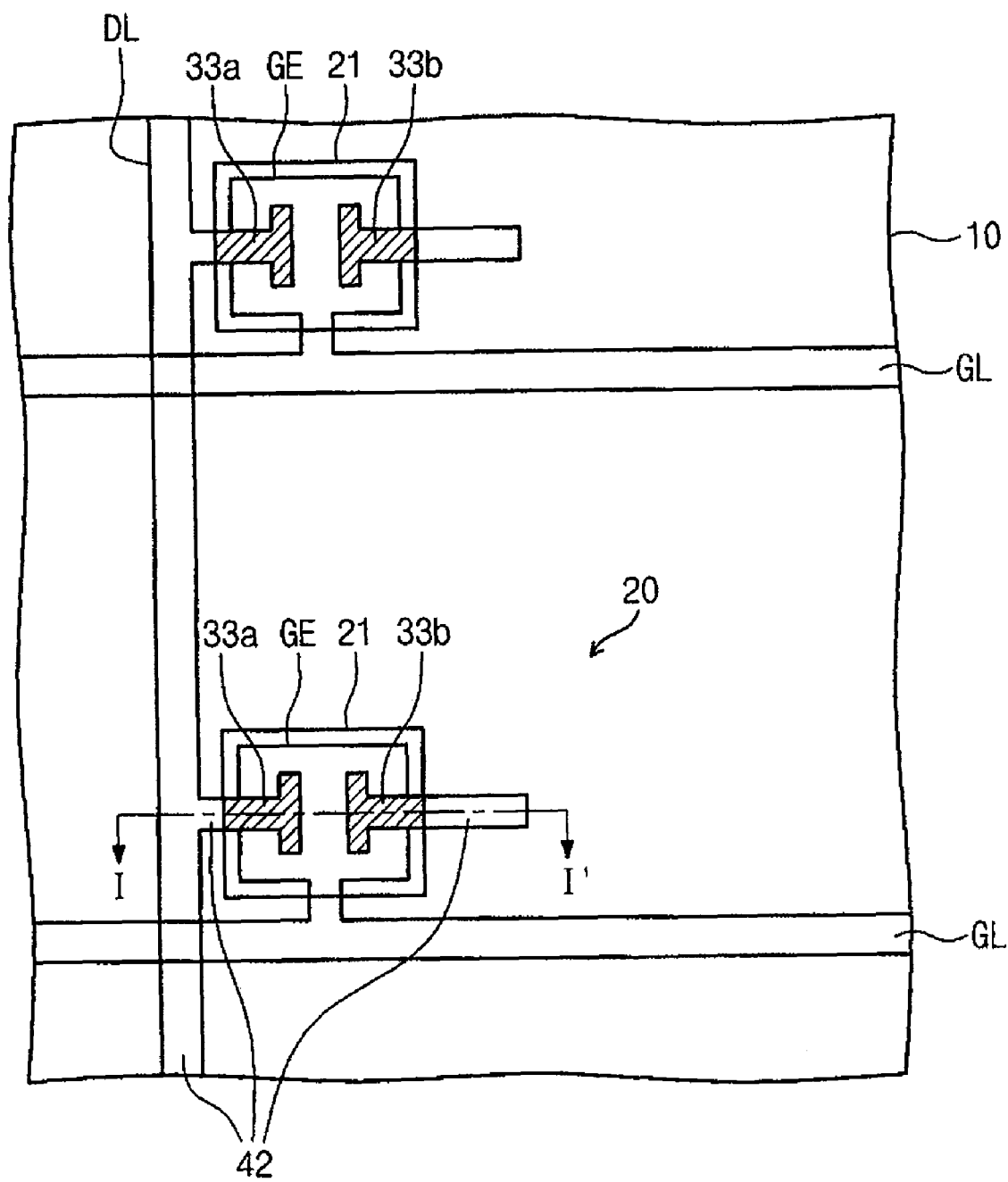
Figure 7B:
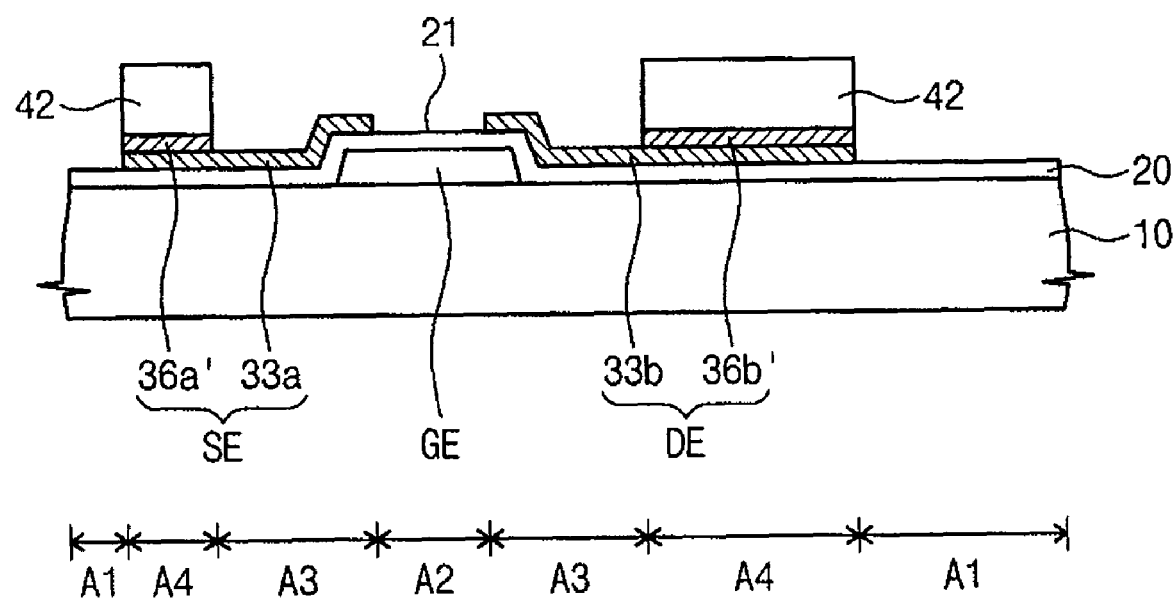

Referring to FIGS. 6B, 7A and 7B, the top preliminary source electrode 36a and the top preliminary drain electrode 36b corresponding to the third area A3 are patterned using the third insulating layer pattern 42, respectively, to form a top source electrode 36a' and a top drain electrode 36b', thereby completing fabrication of a source electrode SE including the top source electrode 36a' and the bottom source electrode 33a, and a drain electrode DE including the top drain electrode 36b' and the bottom drain electrode 33b.

The reason that the top preliminary source electrode 36a and the top preliminary drain electrode 36b that correspond to the third area A3 are removed is because the organic semiconductor layer has a lower contact resistance relative to the bottom source electrode 33a and the bottom drain electrode 33b than the top source electrode 36a' and the top drain electrode 36b'.

For example, when the bottom source electrode 33a and the bottom drain electrode 33b include indium tin oxide (ITO) having a low contact resistance relative to the organic semiconductor layer, the organic semiconductor layer may be electrically connected to the bottom source electrode 33a and the bottom drain electrode 33b by removing the top preliminary source electrode 36a and the top preliminary drain electrode 36b corresponding to the third area A3.

When the top source electrode 36a' and the top drain electrode 36b' include a conductor having a low contact resistance relative to the organic semiconductor layer, the process of removing the top preliminary source electrode 36a and the top preliminary drain electrode 36b corresponding to the third area A3 may also be omitted.

Figure 8A:
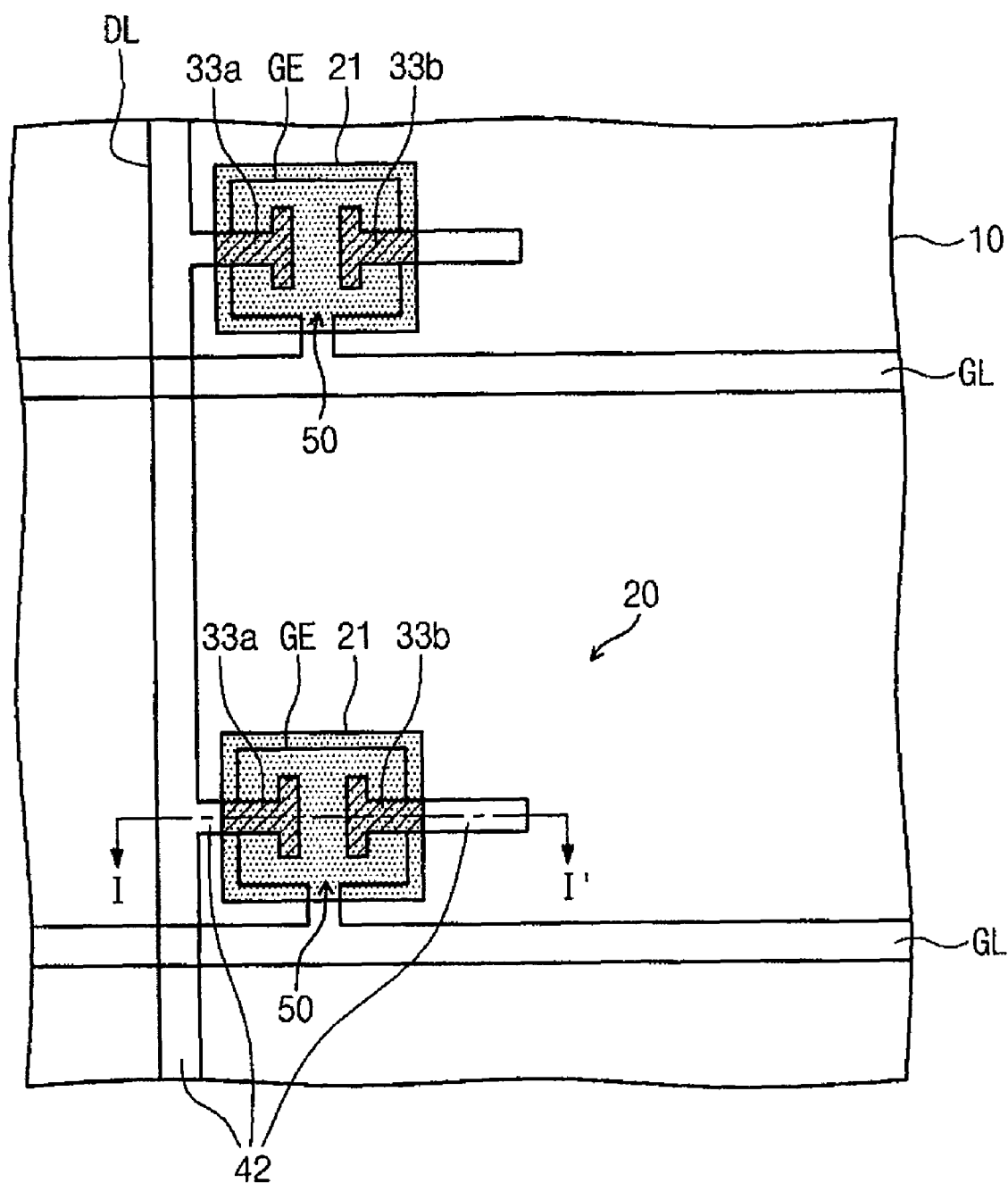
Figure 8B:
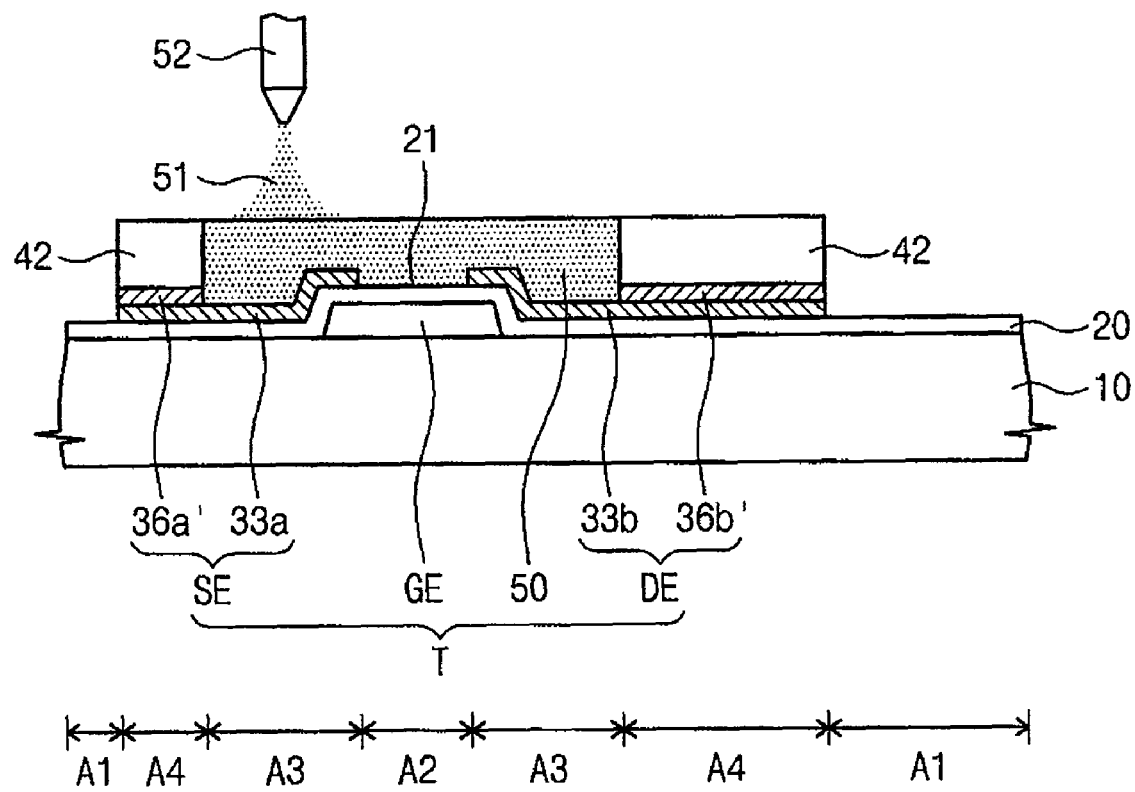

Referring to FIGS. 8A and 8B, an organic semiconductor layer 50 may be formed on the second and third areas A2 and A3 by spraying an organic semiconductor 51 toward the second and third areas A2 and A3 through a dispenser 52, thereby completing fabrication of an organic thin film transistor T that includes the source electrode SE, the gate electrode GE, the drain electrode DE and the organic semiconductor layer 50. The organic semiconductor layer 50 may include an organic material having high flexibility and conductivity such as pentacene, and may serve as an active pattern of the organic thin film transistor T.

The organic semiconductor layer 50 may be easily formed by spraying the organic semiconductor 51 toward the substrate 10 since the non-surface treatment section 21 of the gate insulating layer 20 has a surface energy greater than that of the peripheral section.

Referring again to FIG. 5B, since the third insulating layer pattern 42 is surface-treated through the surface treatment process, the third insulating layer pattern 42 has a surface energy lower than that of the non-surface treatment section 21. Thus, attraction between the non-surface treatment section 21 and the organic semiconductor 51 is greater than between the third insulating layer pattern 42 and the organic semiconductor 51. Consequently, although the dispenser 52 may not exactly (directly) spray the organic semiconductor 51 onto the second and third areas A2 and A3, the organic semiconductor 51 may move (gravitate) towards the non-surface treatment section 21 without remaining around the second and third areas A2 and A3, such as the third insulating layer pattern 42.

As a result, when forming the organic semiconductor layer 50 by spraying the organic semiconductor 51, since the organic semiconductor 51 is realigned by the surface energy difference, the process of spraying the organic semiconductor 51 toward the substrate 10 may be performed with a sufficient margin.

Figure 9A:
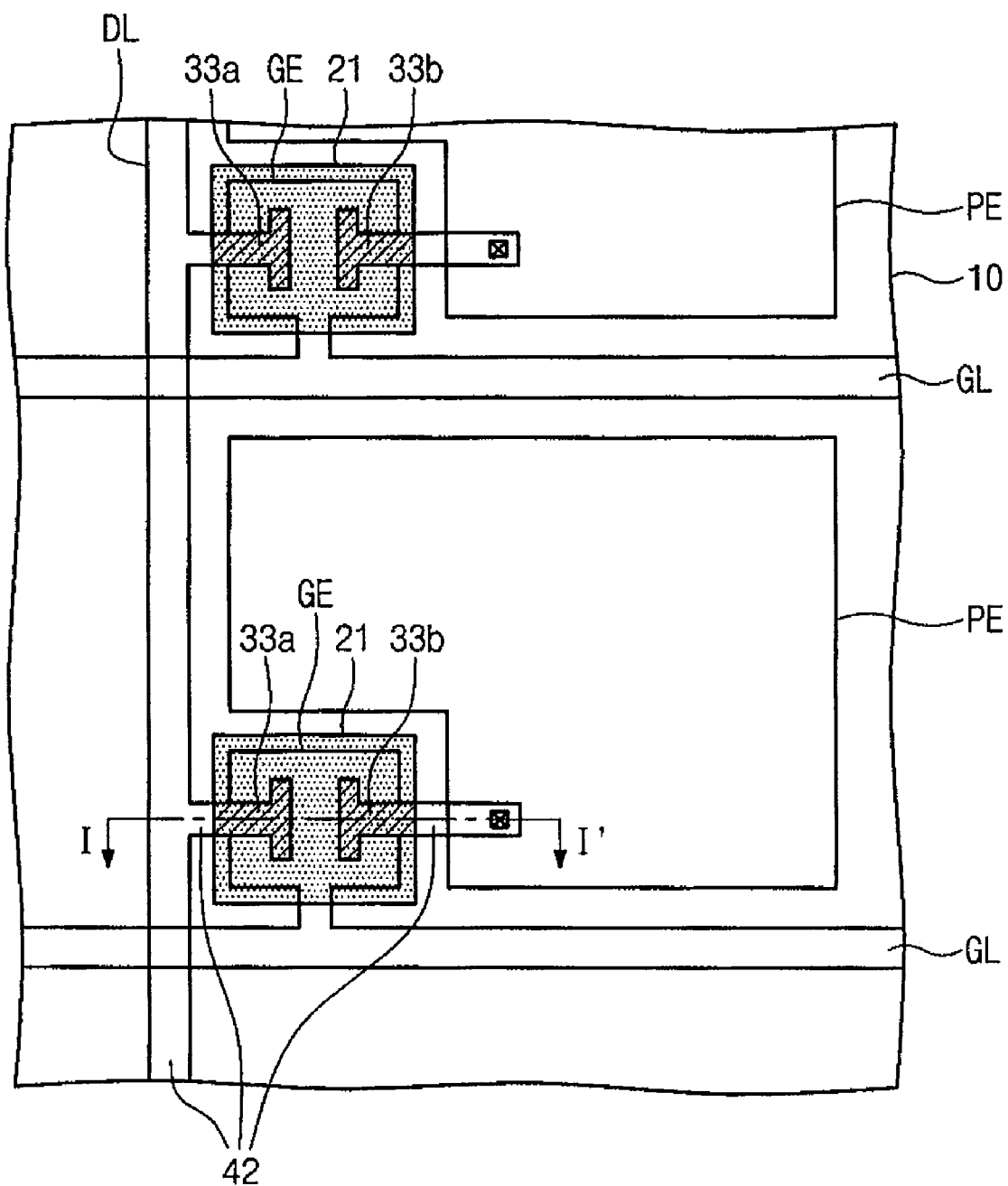
Figure 9B:
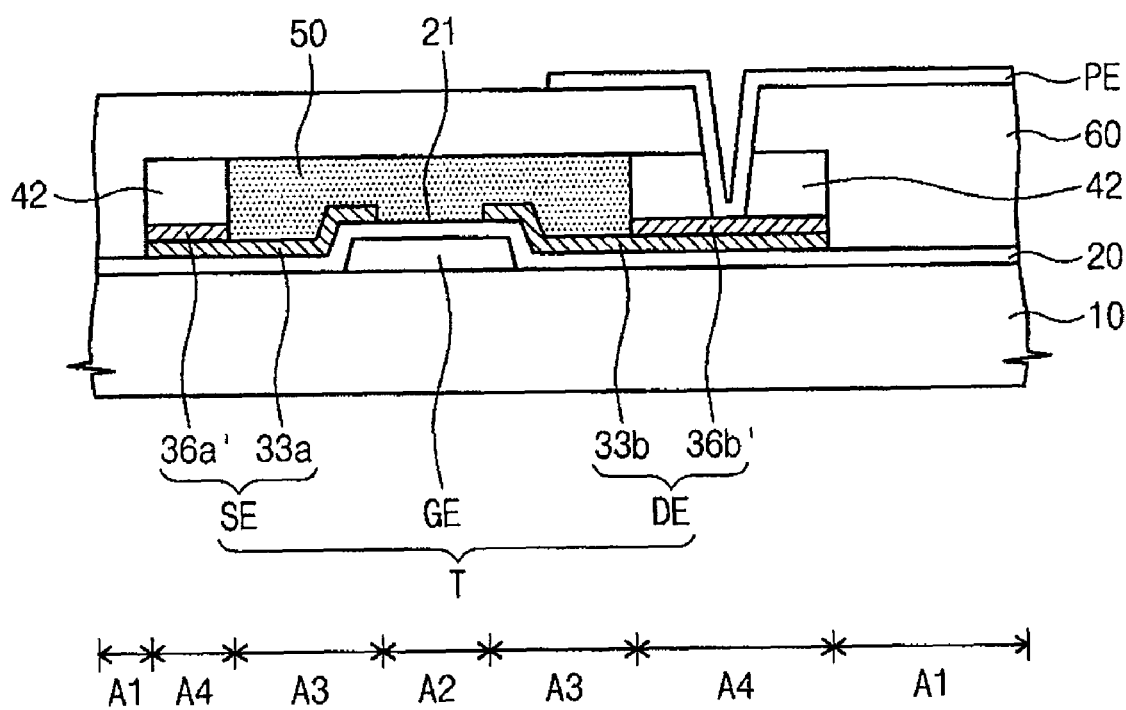

Referring to FIGS. 9A and 9B, after forming an interlayer dielectric layer 60 on the substrate 10 on which the organic semiconductor layer 50 is formed, a pixel electrode PE may then be formed on the interlayer dielectric layer 60. The pixel electrode PE may be electrically connected to the drain electrode DE through a contact hole formed through the interlayer dielectric layer 60.

The pixel electrode PE is formed in a pixel area defined in the substrate 10. Although not shown in detail in FIGS. 9A and 9B, the pixel area is defined by the gate line GL and the data line DL that cross each other. A plurality of pixel areas is defined in proportion to the number of the gate and data lines GL and DL formed on the substrate 10. The pixel electrode PE is formed in each pixel area.

Hereinafter, the final structure of the display substrate manufactured by a manufacturing method of the display substrate according to one or more embodiments of the present invention will be described in more detail with reference to FIGS. 9A and 9B.

The gate line GL and the data line DL are formed on the substrate 10 and are insulated from each other by interposing the gate insulating layer 20 therebetween. The gate line GL crosses the data line DL, thereby defining the pixel area. Furthermore, the pixel electrode PE is formed in each pixel area. Although the pixel area is not shown in FIGS. 9A and 9B, the pixel area may be regarded (considered) as an area in which the pixel electrode PE is formed.

An organic thin film transistor T electrically connected to the pixel electrode PE is formed in the pixel area. The organic thin film transistor T includes the gate electrode GE branching from the gate line GL, the source electrode SE branching from the data line DL, the drain electrode DE, which includes material the same as that of the data line DL, and the organic semiconductor layer 50.

Referring to FIGS. 2A to 7B, the data line DL, the source electrode SE and the drain electrode DE may be made by forming the first conductive layer 31 on the substrate 10, forming the second conductive layer 34 on the first conductive layer 31, and then patterning the first and second conductive layers 31 and 34. Thus, the data line DL, the source electrode SE and the drain electrode DE include the first conductive layer 31 and the second conductive layer 34 that is laminated on the first conductive layer 31.

The source electrode SE includes the bottom source electrode 33a, which includes material the same as that of the first conductive layer 31, and the top source electrode 36a, which includes material the same as that of the second conductive layer 34. The drain electrode DE includes the bottom drain electrode 33b, which includes material the same as that of the first conductive layer 31, and the top drain electrode 36b, which includes material the same as that of the second conductive layer 34.

Furthermore, since the second conductive layer 34 may be removed from the area in which the source electrode SE, the drain electrode DE and the organic semiconductor layer 50 overlap each other, the top source electrode 36a may have a shape different than that of the bottom source electrode 33a when viewed in a plan view, and the top drain electrode 36b may have a shape different than that of the bottom drain electrode 33b when viewed in a plan view. The reason for removing the second conductive layer 34 from the area in which the organic semiconductor layer 50 is formed is because the contact resistance between the first conductive layer 31 and the organic semiconductor layer 50 is lower than the contact resistance between the second conductive layer 34 and the organic semiconductor layer 50.

As described above, each of the data line DL, the source electrode SE and the drain electrode DE may include the first conductive layer 31 and the second conductive layer 34 formed on the first conductive layer 31 in an area in which the organic semiconductor layer 50 is not formed. Since the second conductive layer 34 may be removed from the area in which the organic semiconductor layer 50 is formed, each of the source electrode SE and the drain electrode DE may include only the first conductive layer 31 in such area in which the organic semiconductor layer 50 is formed.

The material of the second conductive layer 34 may be selected such that the contact resistance between the second conductive layer 34 and the organic semiconductor layer 50 is low. Since the top source electrode 36a may have a shape identical to that of the bottom source electrode 33a when viewed in a plan view, the top source electrode 36a may make contact with the organic semiconductor layer 50. In addition, since the top drain electrode 36b may have a shape identical to that of the bottom drain electrode 33b when viewed in a plan view, the top drain electrode 36b may also make contact with the organic semiconductor layer 50.

Furthermore, the insulating layer pattern 42 may be formed on the data line DL, the source electrode SE and the drain electrode DE. The insulating layer pattern 42 may be located on the same plane with the data line DL, the source electrode SE and the drain electrode DE in an area in which the organic semiconductor layer 50 is not formed. As a result, the second conductive layer 34 and the insulating layer pattern 42 may be located on the same plane.

The organic semiconductor layer 50 may partially overlap the source electrode SE and the drain electrode DE, and face the gate electrode GE while interposing the gate insulating layer 20 therebetween. The organic semiconductor layer 50 may include an organic material having high flexibility and conductivity such as pentacene, and may serve as the active pattern of the organic thin film transistor T.

A portion of the gate insulating layer 20 corresponding to an area in which the organic semiconductor layer 50 is formed may have a surface energy greater than that of the insulating layer pattern 42. Referring again to FIGS. 5A and 5B, when a portion is defined as a non-surface treatment section 21, the non-surface treatment section 21 is not surface-treated by the first preliminary conductive pattern 32 during, for example, the plasma treatment process for the substrate 10. Thus, the non-surface treatment section 21 may have a surface energy greater than that of the insulating layer pattern 42 and the gate insulating layer 20, which are exposed to the exterior.

The interlayer dielectric layer 60 that covers the organic thin film transistor T is formed on the substrate 10, and a contact hole is formed through the interlayer dielectric layer 60 such that the top drain electrode 36b is exposed. Further, the pixel electrode PE is formed on the interlayer dielectric layer 60, and is electrically connected to the top drain electrode 36b through the contact hole.

According to embodiments of the display substrate and the method of manufacturing the display substrate, when forming the organic semiconductor layer through an inkjet method, the bank pattern used for the organic semiconductor layer may be omitted. Accordingly, a photolithography process for the bank pattern may also be omitted, so that the manufacturing process of the display substrate may be simplified and the manufacturing cost of the display substrate may be reduced.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display substrate, the method comprising:
   forming a gate electrode on a substrate;
   forming a gate insulating layer on the substrate to cover the gate electrode;
   sequentially forming first and second conductive layers on the gate insulating layer to form a source-drain layer;

forming a first insulating layer pattern on the source-drain layer;

patterning the source-drain layer by using the first insulating layer pattern and a second insulating layer pattern, which is formed by primarily etching the first insulating layer pattern, as etch masks to form a preliminary source-drain layer;

secondarily etching the second insulating layer pattern to form a third insulating layer pattern;

performing a surface treatment relative to the substrate;

patterning the preliminary source-drain layer to form a source electrode and a drain electrode, which are spaced apart from each other;

forming an organic semiconductor layer on the source and drain electrodes; and forming a pixel electrode on the substrate wherein the pixel electrode is electrically connected to the drain electrode.

2. The method of claim 1, wherein the surface treatment for the substrate comprises a plasma treatment.

3. The method of claim 1, wherein the substrate comprises glass or plastic.

4. The method of claim 1, wherein the forming of the organic semiconductor layer further comprises providing an organic semiconductor toward the substrate through an inkjet method.

5. The method of claim 1, wherein the first insulating layer pattern is divided into first, second, third, and fourth areas.

6. The method of claim 5, wherein the first area corresponds to an area in which the pixel electrode is formed, and the second and third areas correspond to an area in which the organic semiconductor layer is formed.

7. The method of claim 5, wherein a first portion of the first insulating layer pattern corresponding to the first area has an opening, a second portion of the first insulating layer pattern corresponding to the second area has a first thickness, a third portion of the first insulating layer pattern corresponding to the third area has a second thickness greater than the first thickness, and a fourth portion of the first insulating layer pattern corresponding to the fourth area has a third thickness greater than the second thickness.

8. The method of claim 5, wherein the forming of the preliminary source-drain layer comprises:

removing the source-drain layer corresponding to the first area by using the first insulating layer pattern as an etch mask to form a preliminary source-drain pattern comprising first and second preliminary conductive patterns; and removing the second preliminary conductive pattern corresponding to the second area by using the second insulating layer pattern as an etch mask to form a second conductive layer pattern and exposing the first preliminary conductive pattern corresponding to the second area.

9. The method of claim 8, wherein the forming of the source and drain electrodes comprises forming a first conductive layer pattern and exposing a portion of the gate insulating layer corresponding to the second area by removing the first preliminary conductive pattern corresponding to the second area by using the second conductive layer pattern as an etch mask, and wherein the exposed portion of the gate insulating layer has a surface energy greater than that of a peripheral section thereof.

10. The method of claim 9, wherein the forming of the source and drain electrodes further comprises removing the first conductive layer pattern corresponding to the third area by using the third insulating layer pattern.

11. The method of claim 10, wherein the forming of the first insulating layer pattern comprises:

forming an insulating layer having a photosensitivity on the source-drain layer;

aligning a photomask such that the photomask faces the substrate and irradiating different amounts of light onto the first to fourth areas; and developing the insulating layer.

12. The method of claim 11, wherein a first part of the photomask corresponding to the first area transmits a first amount of light to the insulating layer, a second part of the photomask corresponding to the second area is formed with a transflective member or a slit pattern to transmit a second amount of light smaller than the first amount of light to the insulating layer, a third part of the photomask corresponding to the third area is formed with the transflective member and the slit pattern to transmit a third amount of light smaller than the second amount of light to the insulating layer, and the photomask corresponding to the fourth area is formed with a light blocking member to block the light.

13. The method of claim 10, wherein the forming of the first insulating layer pattern further comprises:

forming an insulating layer on the source-drain layer; and pressing the insulating layer by using a mold.

* * * * *